(12) United States Patent
Kim et al.

(10) Patent No.: US 9,263,438 B2
(45) Date of Patent: Feb. 16, 2016

(54) APPARATUS RELATED TO A DIODE DEVICE INCLUDING A JFET PORTION

(75) Inventors: Sunglyong Kim, Falmouth, ME (US); Jongjib Kim, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 724 days.

(21) Appl. No.: 13/427,541

(22) Filed: Mar. 22, 2012

(65) Prior Publication Data

US 2013/0248947 A1    Sep. 26, 2013

(51) Int. Cl.
H01L 29/66    (2006.01)
H01L 29/80    (2006.01)
H01L 21/70    (2006.01)
H01L 27/07    (2006.01)
H01L 27/098    (2006.01)

(52) U.S. Cl.
CPC ........... *H01L 27/0727* (2013.01); *H01L 27/098* (2013.01)

(58) Field of Classification Search
None
See application file for complete search history.

(56) References Cited

U.S. PATENT DOCUMENTS

| | | | |
|---|---|---|---|
| 4,494,134 A * | 1/1985 | Wildi et al. | 257/273 |
| 5,412,234 A * | 5/1995 | Schoofs et al. | 257/256 |
| 6,507,085 B2 | 1/2003 | Shimizu | |
| 7,064,407 B1 * | 6/2006 | Mallikarjunaswamy | 257/471 |
| 7,928,509 B2 * | 4/2011 | Huang | 257/348 |
| 2010/0295101 A1 * | 11/2010 | Huang | 257/265 |

FOREIGN PATENT DOCUMENTS

WO    01/59846 A1    8/2001

OTHER PUBLICATIONS

Current Sensing Single Channel Driver, Data Sheet No. PD60143K, International Rectifier, Jan. 18, 2000, 15 pages.
Adaptive Ballast Control IC, Data Sheet No. PD60212 rev C, International Rectifier, Mar. 1, 2005, 17 pages.

* cited by examiner

*Primary Examiner* — Hoang-Quan Ho
(74) *Attorney, Agent, or Firm* — Brake Hughes Bellermann LLP

(57) ABSTRACT

In one general aspect, an apparatus can include an anode terminal, and a cathode terminal. The apparatus can include a junction field-effect transistor (JFET) portion having a channel disposed within a semiconductor substrate and defining a first portion of an electrical path between the anode terminal and the cathode terminal. The apparatus can also include a diode portion formed within the semiconductor substrate and defining a second portion of the electrical path between the anode terminal and the cathode terminal. The diode portion can be serially coupled to the channel of the JFET device.

23 Claims, 10 Drawing Sheets

APPARATUS RELATED TO A DIODE DEVICE INCLUDING A JFET PORTION

TECHNICAL FIELD

This description relates to a diode device including a junction field-effect transistor portion.

BACKGROUND

Various types of discrete semiconductor components can be used together to perform a variety of functions in computing applications. Using separate discrete semiconductor components, however, can have many disadvantages. For example, the cost of producing multiple separate components can be greater than the cost for integrating several devices into a single discrete component. Also, individual discrete components can have heat transfer issues, leakage problems, and/or so forth that may not be reduced in a desirable fashion when used in conjunction with other discrete components. Thus, a need exists for systems, methods, and apparatus to address the shortfalls of present technology and to provide other new and innovative features.

SUMMARY

In one general aspect, an apparatus can include an anode terminal, and a cathode terminal. The apparatus can include a junction field-effect transistor (JFET) portion having a channel disposed within a semiconductor substrate and defining a first portion of an electrical path between the anode terminal and the cathode terminal. The apparatus can also include a diode portion formed within the semiconductor substrate and defining a second portion of the electrical path between the anode terminal and the cathode terminal. The diode portion can be serially coupled to the channel of the JFET device.

In another general aspect, an apparatus can include an anode terminal and a cathode terminal. The apparatus can include an isolation region having a heavily doped portion disposed below the anode terminal, and a lightly doped portion disposed between the heavily doped portion and the cathode terminal. The apparatus can include a junction field-effect transistor (JFET) portion having a channel disposed within the isolation region, and a diode portion including a PN junction having at least a portion disposed between the anode terminal and the heavily doped portion of the isolation region.

In yet another general aspect, a method can include forming an isolation region having a first dopant type and having at least a portion defining a channel of a junction field-effect transistor (JFET) portion of a diode device, and implanting a well region having a second dopant type different from the first dopant type in the JFET portion. The method can include forming an oxide layer above the isolation region, and forming a PN junction serially coupled to the isolation region and included in a diode portion of the diode device above the isolation region. The method can also include implanting a sink, having the first dopant type, between the oxide layer and the isolation region, and between the well region of the JFET portion and the PN junction of the diode portion.

The details of one or more implementations are set forth in the accompanying drawings and the description below. Other features will be apparent from the description and drawings, and from the claims.

DETAILED DESCRIPTION

Figure 1:
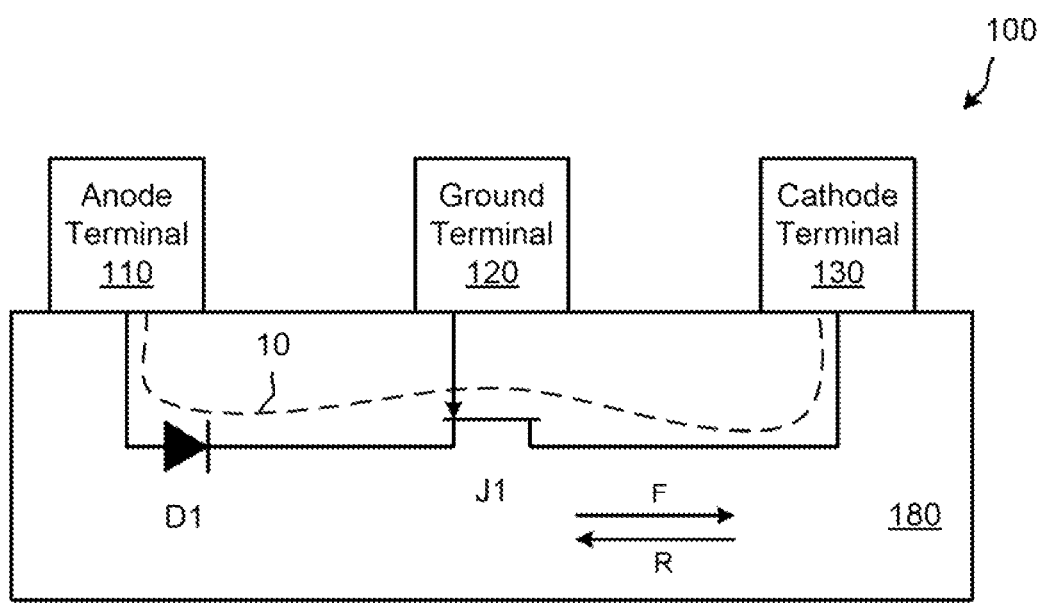
FIG. 1 is diagram that illustrates a diode device, according to an embodiment.

FIG. 1 is diagram that illustrates a diode device 100, according to an embodiment. As shown in FIG. 1, the diode device 100 includes a diode portion D1 and a junction field-effect transistor (JFET) portion J1. As shown in FIG. 1, the diode portion D1 is coupled to an anode terminal 110 and the JFET portion J1 is coupled to a cathode terminal 130. The JFET portion J1 has a gate coupled to a ground terminal 120, and the ground terminal 120 can be coupled to a ground voltage. In some embodiments, the ground terminal 120 can be referred to as a gate terminal. As shown in FIG. 1, the diode portion D1 and the JFET portion J1 are included in a semiconductor substrate 180. In some embodiments, the diode device 100 can be referred to, or used, as a bootstrap diode, or as a bootstrap diode device.

As shown in FIG. 1, the diode portion D1 and a channel of the JFET portion J1 can each form at least a portion of a path 10 (e.g., an electrical path) between the anode terminal 110 and the cathode terminal 130. In some embodiments, the diode device 100 can define (e.g., form) a first portion of the path 10 and the channel of the JFET portion J1 can define a second portion of the path 10.

The diode device 100 is configured so that when a positive voltage is applied between the anode terminal 110 and the cathode terminal 130 (i.e., when a potential at the anode terminal 110 is higher than a potential at the cathode terminal 130) to forward bias the diode portion D1 and when the JFET portion J1 is in an on-state (e.g., activated, conducting), current flows along direction F between the anode terminal 110 and the cathode terminal 130 through a channel of the JFET portion J1. In such embodiments, the ground terminal 120 can be coupled to a ground voltage so that the channel of the JFET portion J1 is in the on-state. In some embodiments, the voltage of the ground terminal 120 can be equal to the voltage of the cathode terminal 130. In some embodiments, diode device 100 can be referred to as being forward biased, or in a forward-biased mode, when both the diode portion D1 is forward biased and the JFET portion J1 is in an on-state.

The diode device 100 can also be configured so that when a negative voltage is applied between the anode terminal 110 and the cathode terminal 130 to reverse bias the diode portion D1 (i.e., when a potential at the cathode terminal 130 is higher than a potential at the anode terminal 110), the JFET portion J1 can be in an off-state (e.g., deactivated, blocking, changed to an on-state). In such embodiments, the channel of the JFET portion J1 may be depleted (e.g., pinched off) so that current may be prevented from flowing through the JFET portion J1. In other words, current may be prevented (e.g., blocked) from flowing along direction R between the cathode terminal 130 to the anode terminal 110 through the channel of the JFET portion J1. Even though the diode portion D1 can be functioning as a blocking diode when reverse biased, the JFET portion J1 can further function as a blocking component between the cathode terminal 130 and the anode terminal 110. In some embodiments, diode device 100 can be referred to as being reverse biased, or in a reverse-biased mode, when both the diode portion D1 is reverse biased and/or when the JFET portion J1 is in an off-state. In some embodiments, when the diode portion D1 is reverse biased, the JFET portion J1 may be in an on-state.

Because the diode device 100 includes not only the diode portion D1, but also the JFET portion J1, the diode device 100 can have a relatively high blocking voltage. Specifically, the diode device 100 can have a blocking voltage using a combination of the diode portion D1 and the JFET portion J1 that is significantly higher than a blocking voltage that can be achieved using the diode portion D1 alone.

As shown in FIG. 1, the diode portion D1 and the JFET portion J1 are integrated into the diode device 100. In other words, the diode portion D1 and the JFET portion J1 are fabricated (e.g., process) within the semiconductor substrate 180. In other words, the semiconductor substrate 180 is common to the diode portion D1 and the JFET portion J1. In some embodiments, at least a portion of the diode portion D1 and/or the JFET portion J1 can be included in an epitaxial layer (not shown) of the semiconductor substrate 180.

In some embodiments, one or more portions of the semiconductor substrate 180 may be implemented using various types of semiconductor processing techniques associated with semiconductor substrates including, but not limited to, for example, Silicon (Si), Germanium (Ge), Silicon Germanium (SiGe), Gallium Arsenide (GaAs), Silicon Carbide (SiC), type III-V semiconductor substrates, type II-VI semiconductor substrates, and/or so forth. More details related to fabrication of the diode device 100 are described below in connection with at least some of the figures.

In some embodiments, when the diode portion D1 of the diode device 100 is forward biased, a voltage drop across the diode portion D1 can be approximately 0.7 V and an overall voltage drop between the anode terminal 110 and the cathode terminal 130 can be greater than approximately 0.7 V. Specifically, the overall voltage drop between the anode terminal 110 and the cathode terminal 130 can be greater than approximately 0.7 V because of the combination of the voltage drop through the JFET portion J1 and the voltage drop across the diode device 100. In some embodiments, the voltage drop across the diode portion D1, when forward biased, can be referred to as the forward-biased voltage drop. The diode portion D1 can be forward biased, for example, when the voltage at the anode terminal 110 is greater than approximately 2 V (e.g., 3 V) with respect to a ground voltage at the ground terminal 120 and at the cathode terminal 130. The PN junction of the diode portion D1 will have a voltage drop of 0.7 V, and the remainder of the voltage drop can be due to other resistances within the diode device 100 (e.g., resistance within the JFET portion J1).

For example, when the diode portion D1 of the diode device 100 is forward biased, a voltage drop across the diode portion D1 can be approximately 0.7 V and a voltage drop across the JFET portion J1 can be approximately 1 V. Accordingly, the overall voltage drop between the anode terminal 110 and the cathode terminal 130 can be approximately 1.7 V. The voltage drop across the JFET portion J1 can be based on a resistance of, for example, the channel of the JFET portion J1 and/or other features in the JFET portion J1. In some embodiments, the voltage drop across the JFET portion J1 can be less than, greater than, or approximately the same as the voltage drop across the diode portion D1 (which can be approximately 0.7 V) when the diode portion D1 is forward biased. In some embodiments, the overall voltage drop between the anode terminal 110 and the cathode terminal 130 can be more than 2 times the voltage drop across the diode portion D1 when the diode portion D1 is forward biased.

In some embodiments, current may not flow (or substantially flow) between the anode terminal 110 and the cathode terminal 130 until the overall voltage drop between the anode terminal 110 and the cathode terminal 130 is at least greater than the forward-biased voltage drop across the diode portion D1. In some embodiments, current may not flow (or substantially flow) between the anode terminal 110 and the cathode terminal 130 until the overall voltage drop between the anode terminal 110 and the cathode terminal 130 is between the forward-biased voltage drop across the diode portion D1 and approximately 2 times the forward-biased voltage drop across the diode portion D1. In some embodiments, current may not flow (or substantially flow) between the anode terminal 110 and the cathode terminal 130 until the overall voltage drop between the anode terminal 110 and the cathode terminal 130 is greater than approximately 2 times the forward-biased voltage drop across the diode portion D1.

In some embodiments, when the diode portion D1 of the diode device 100 is reverse biased, the overall voltage drop between the cathode terminal 130 and the anode terminal 110 can be zero or greater (referenced to the cathode terminal 110 or the ground terminal 120). Also, in some embodiments, when the diode portion D1 of the diode device 100 is reverse biased, the overall voltage drop between the cathode terminal 130 and the ground terminal 120 can be zero or greater (referenced to the ground terminal 120). In some embodiments, when the diode portion D1 of the diode device 100 is reverse biased, the overall voltage drop between the cathode terminal 130 and the anode terminal 110 can be greater than 10 V (e.g., 50 V, 120 V, 200 V).

In some embodiments, the diode portion D1 of the diode device 100 can be a relatively low-voltage diode and the JFET device J1 can be a relatively high-voltage device. Specifically, the JFET device J1 can be configured to block a higher voltage (without failing in an undesirable fashion) than a voltage that can be blocked by the diode portion D1 (without failing in an undesirable fashion). In other words, the JFET device J1 can have a higher blocking voltage (BV) rating than the diode portion D1. In some embodiments, the JFET device J1 can have a blocking voltage rating that is many times higher than a blocking voltage rating of the diode portion D1.

In some embodiments, the diode device 100 can include more than one diode portion such as diode portion D1. In some embodiments, the diode device 100 can include more than one JFET portion such as JFET portion J1. In some embodiments, the diode device 100 can include other types of depletion devices such as the JFET portion to block current from flowing when the diode device 100 is in a reverse-biased state. In some embodiments, the diode portion D1 can be a Schottky diode, or other type of diode.

The diode device 100 can be used in a variety of applications including relatively high voltage applications. The diode device 100 can be used in any type of electronic device related to, for example, computer processing, lighting applications, automobile applications, air-conditioning applications, portable computing device applications, industrial applications, telecom, and/or so forth.

Figure 2A:
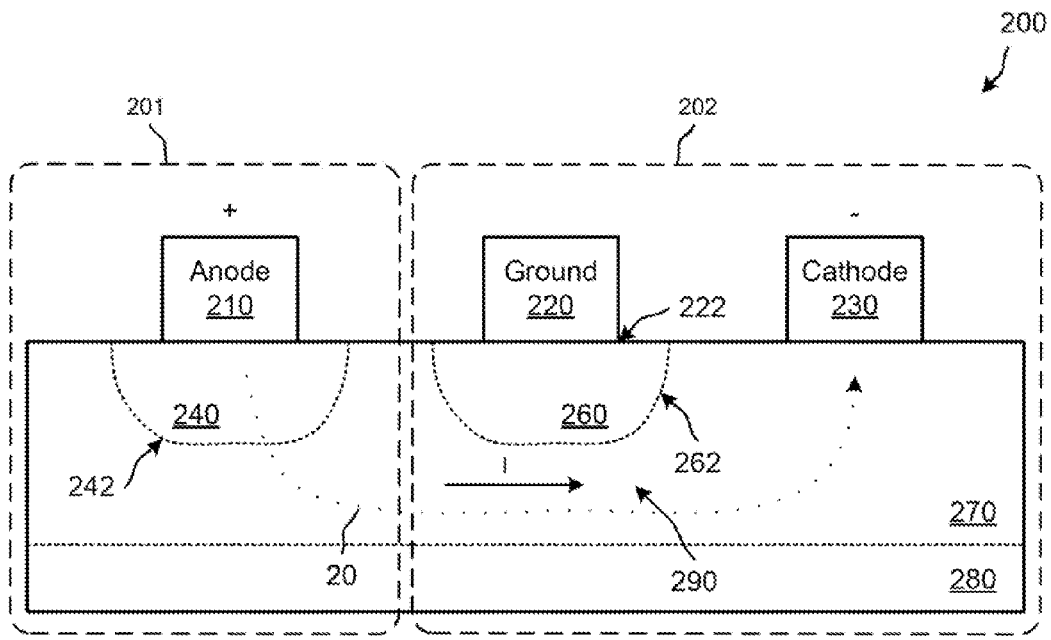
FIGS. 2A and 2B are diagrams that illustrate another diode device, according to an embodiment.

FIG. 2A is diagram that illustrates a diode device 200, according to an embodiment. As shown in FIG. 2A, the diode device 200 includes a diode portion 201 and a JFET portion 202. As shown in FIG. 2A, the diode portion 201 includes an anode terminal 210 and the JFET portion 202 includes a ground terminal 220 and a cathode terminal 230. The ground terminal 220 can be coupled to a ground voltage. As shown in FIG. 2A, portions of the diode portion 201 and the JFET portion 202 are included in an epitaxial layer 270 of a semiconductor substrate 280. In some embodiments, the diode device 200 can be referred to as a bootstrap diode.

As shown in FIG. 2A, the diode portion 201 and a channel 290 of the JFET portion 202 can each form at least a portion of a path 20 (e.g., an electrical path) between the anode terminal 210 and the cathode terminal 230. In some embodiments, the diode device 200 can define (e.g., form) a first portion of the path 20 and the channel 290 of the JFET portion 202 can define a second portion of the path 20.

In some embodiments, the ground terminal 220 can be coupled to a P-type dopant region 260, and the anode terminal 210 can be coupled to a P-type dopant region 240. Accordingly, the dopant region in contact with the ground terminal 220 can have the same type of dopant as the dopant region in contact with the anode terminal 210.

For example, a portion of the epitaxial layer 270 around the P-type dopant region 240 can be doped with an N-type dopant so that at a PN junction is formed at an interface 242 between the P-type dopant region 240 and the N-type dopant region around the P-type dopant region 240. When a positive voltage (e.g., a positive voltage greater than a diode voltage drop) is applied between the anode terminal 210 and the cathode terminal 230 (as represented by the "+" and "−" signs above the respective terminals), the diode portion 201 of the diode device 200 can be forward biased. Specifically, the PN junction of the diode portion 201 can be forward biased.

Also, the channel 290 of the JFET portion 202 can be an N-type channel. The channel 290 can be configured to conduct current along direction I (and along the path 20) between the anode terminal 210 and the cathode terminal 230 when the PN junction of the diode portion 201 is forward biased. In other words, the JFET portion 202 can be in an on-state. In some embodiments, the ground terminal 220 can be maintained at a ground voltage when a positive voltage is applied between the anode terminal 210 the cathode terminal 230 so that the PN junction of the diode portion 201 is forward biased. In some embodiments, a voltage between the ground voltage and a voltage applied to the anode terminal 210 can be applied to the ground terminal 220 when the diode portion 201 is forward biased. In some embodiments, a voltage between the ground voltage and a voltage applied to the cathode terminal 230 can be applied to the ground terminal 220 when the diode portion 201 is forward biased.

Figure 2B:
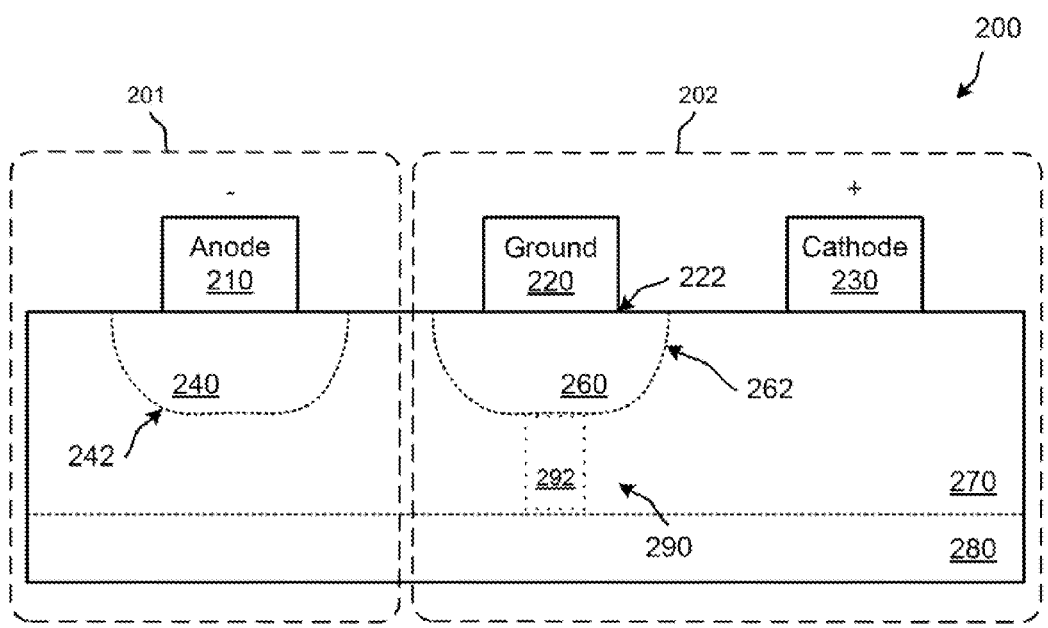

In response to a negative voltage being applied between the anode terminal 210 and the cathode terminal 230 as shown in FIG. 2B (as represented by the "−" and "+" signs above the respective terminals), the PN junction of the diode portion 201 can be reverse biased so that current may not flow between the cathode terminal 230 and the anode terminal 210. Also, at least a portion of the channel 290, which is shown as region 292, can be depleted in response to the negative voltage being applied between the anode terminal 210 and the cathode terminal 230. The depletion of the channel 290 within a region 292 can also prevent (e.g., block, substantially prevent) a current from flowing between the cathode terminal 230 and the anode terminal 210 despite the negative voltage being applied between the anode terminal 210 and the cathode terminal 230.

In some embodiments, blocking of current between the cathode terminal 230 and the anode terminal 210 can, within a negative voltage range including relatively low negative voltages, be provided primarily by the PN junction of the diode portion 201 until depletion of the entire region 292 has occurred, or has substantially occurred. The depletion of the entire region 292 may occur at a negative voltage greater in magnitude than the relatively low negative voltages within the negative voltage range. After depletion of the entire region 292 has occurred, blocking of voltage (and current) between the cathode terminal 230 and the anode terminal 210 can be primarily provided by the JFET portion 202 of the diode device 200.

In some embodiments, a region larger than region 292 can be depleted in response to a negative voltage being applied between the anode terminal 210 and the cathode terminal 230. In some embodiments, the ground terminal 220 can be maintained at a ground voltage when a negative voltage is applied between the anode terminal 210 and the cathode terminal 230. In some embodiments, the anode terminal 210 can be at, or approximately at, a voltage of the ground terminal 220 when the PN junction of the diode portion 201 is reverse biased. In some embodiments, a voltage between the ground voltage and a voltage applied to the cathode terminal 230 can be applied to the ground terminal 220 when the diode portion 201 is reverse biased.

FIG. 3A through 3E are diagrams that collectively illustrate a process for producing a diode device 300, according to an embodiment. As shown in FIGS. 3A through 3E, the diode device 300 includes a diode portion 301 and a JFET portion 302. The diode portion 301 and the JFET portion 302 can be produced (e.g., formed, manufactured) based on a process (e.g., a semiconductor process) used to produce a high-voltage N-type MOSFET (HVNMOS) device. Although the process associated with FIGS. 3A through 3E will be discussed in terms of an N-type MOSFET device and N-type process, in some embodiments, the dopant types can be reversed to produce a diode portion and a JFET portion of a diode device based on a P-type MOSFET device and P-type process. The N-type dopant can include, for example, phosphorus, arsenic, and/or so forth, and the P-type dopants can include, for example, boron.

Also, the process sequence depicted by the cross-sectional views shown in FIGS. 3A through 3E are merely exemplary. Accordingly, various processing steps are simplified and/or intermediate processing steps (e.g., chemical clean processing, chemical polishing, etching, masking, annealing, etc.) are not shown. Although the processing in FIGS. 3A through 3E is discussed in terms of oxides, in some embodiments, the oxides can be replaced with any type of dielectric material such as a high-k dielectric material and/or so forth. Some of the more general features of the diode device 300 are briefly described below in conjunction with FIG. 3E before the details of the process are described.

Figure 3A:
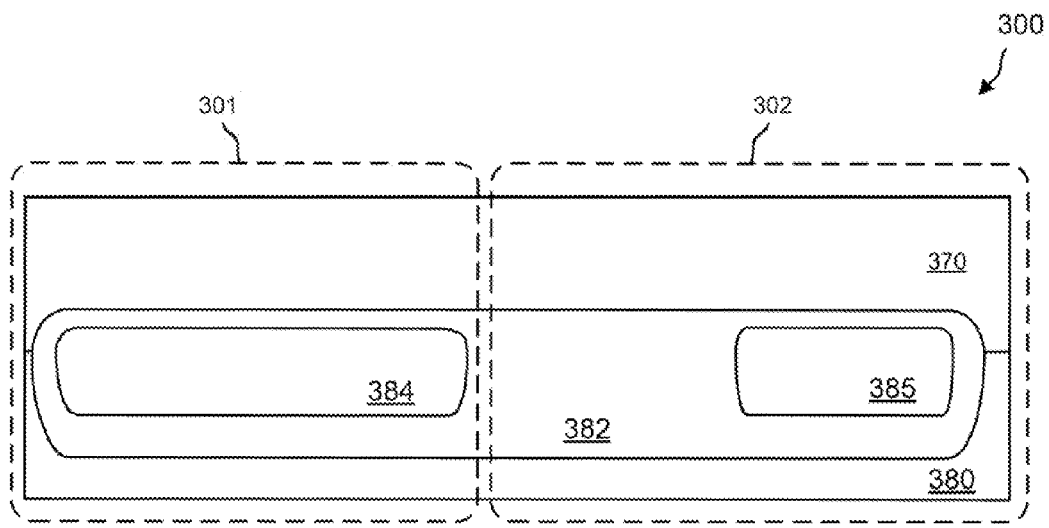
FIG. 3A through 3E are diagrams that collectively illustrate a process for producing a diode device, according to an embodiment.
Figure 3B:
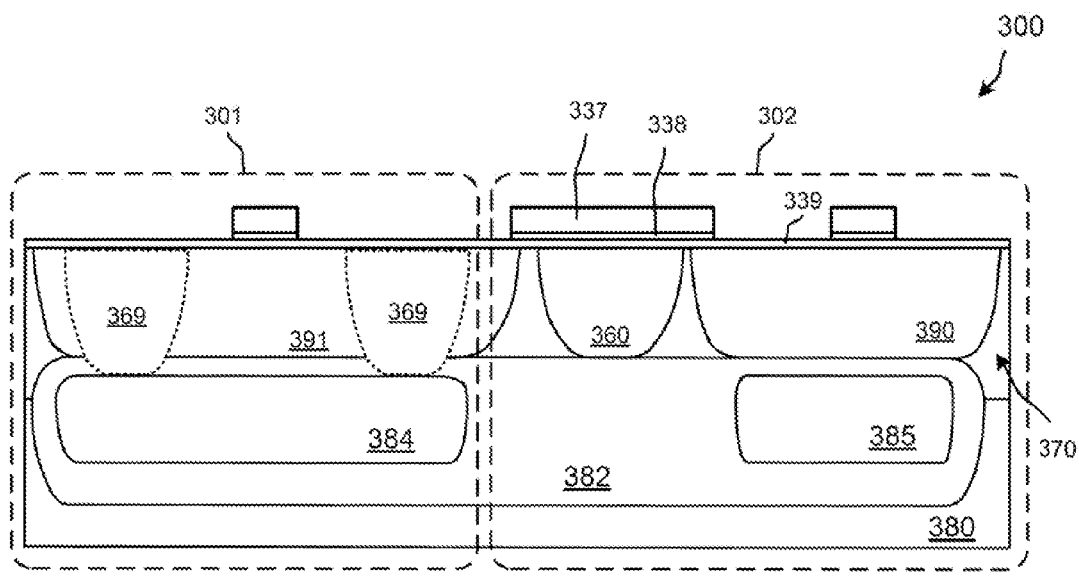
Figure 3C:
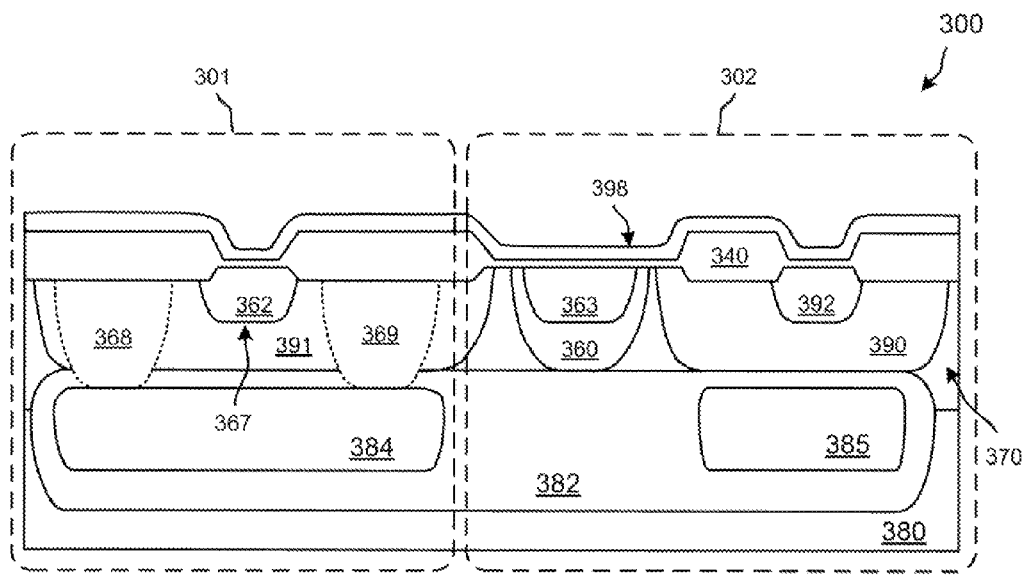
Figure 3D:
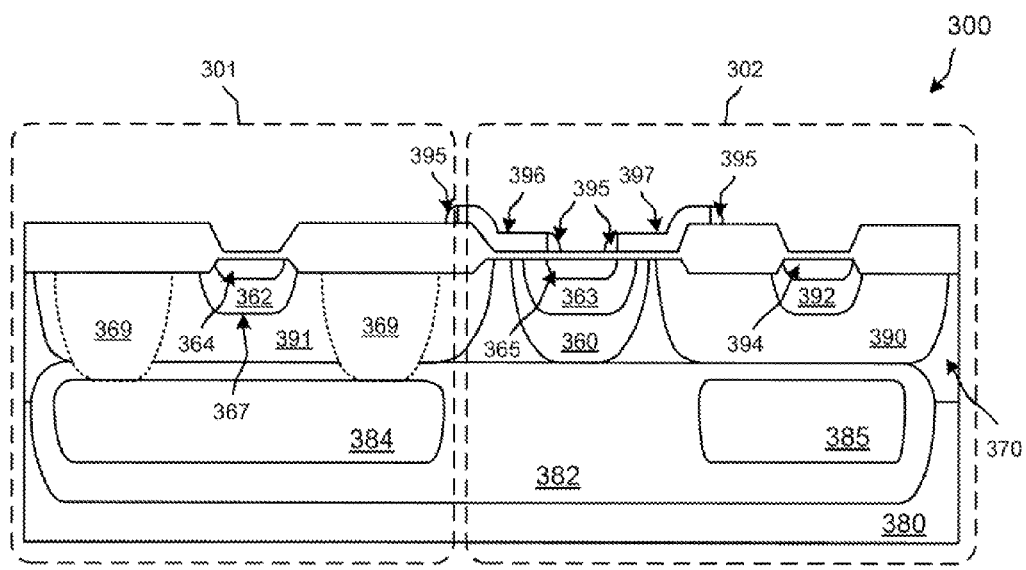
Figure 3E:
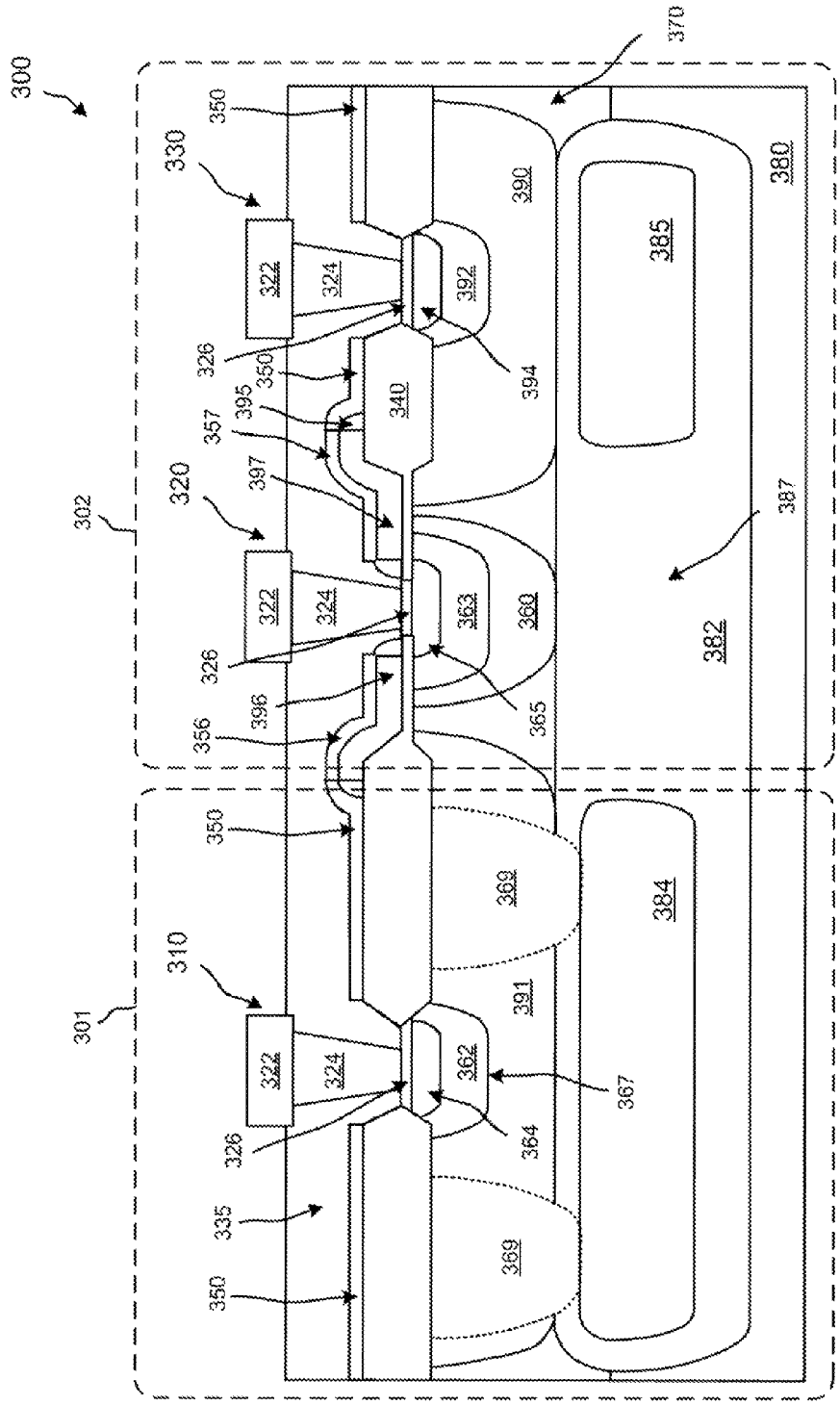

As shown in FIG. 3E, the diode portion 301 includes an anode terminal 310, and the JFET portion 302 includes a ground terminal 320 and a cathode terminal 330. The ground terminal 320 can be coupled to a voltage at, or approximately at, a ground voltage. As shown in FIG. 3A, portions of the diode portion 301 and the JFET portion 302 are included in a P-type epitaxial layer 370 disposed on (e.g., grown on) an N-type semiconductor substrate 380. In some embodiments, the diode device 300 can be referred to as a bootstrap diode.

The diode portion 301 includes a PN junction 367 formed by (e.g., defined by) a P-type well 362 and a high-voltage N-type well (HVNWELL) 391. The PN junction 367 is disposed within N-type sink 369 having N-type dopant concentrations greater than a concentration of the N-type well 391.

Because the N-type sink 369 has a relatively heavy dopant concentrations, the N-type sink 369 can be referred to as N+sink 369.

The JFET portion 302 includes a channel 387 (e.g., a channel region) formed within an isolation region 382 having an N-type dopant (which can be referred to as an N-type isolation (NISO) region). The channel 387 is formed between a first buried layer 384 included in the diode portion 301 of the diode device 300 and a second buried layer 385 included in the JFET portion 302 of the diode device 300. Each of the buried layers 384, 385 are doped with an N-type dopant (which can be referred to as N-type buried layers (NBLs)) having a concentration greater than a concentration of the N-type dopant of the NISO region 382. Because the N-type buried layers 384, 385 have relatively heavy N-type dopant concentrations, the N-type buried layers can be referred to as N+BLs 384, 385.

As shown in FIG. 3E, the N+BL 384 is a heavily doped buried layer disposed below the anode terminal, and the N+BL 385 is a heavily doped buried layer disposed below the cathode terminal. The channel 387 is a relatively lightly doped region disposed between the N+BLs 384, 385 and disposed below the ground terminal 320.

In this embodiment, the N-type buried layer 384 can be configured to block leakage current from the PN junction 367 into the NISO region 382, the semiconductor substrate 380 and/or other regions of the diode device 300. The N+sink 369 can be configured to facilitate blocking of leakage current from the PN junction 367 into the NISO region 382 and/or the semiconductor substrate 380. In particular, the N-type buried layer 385 and the N+sink 369 can collectively be configured to block leakage current (e.g., hole current injection) from the PN junction 367 when the PN junction 367 is forward biased.

Also, in this embodiment, the channel 387 of the JFET portion 302 can be depleted to block voltage (and current flow) between the cathode terminal 330 and the anode terminal 310 when the PN junction 367 is reverse biased. In other words, a blocking voltage can be sustained by pinch off of the JFET portion 302 (which can include the NISO region 382).

Referring now to FIG. 3A which is the beginning of a process used to produce the diode device 300 shown in FIG. 3E, the P-type epitaxial layer 370 can be formed on the N-type semiconductor substrate 380. In some embodiments, the P-type epitaxial layer 370 can be formed after at least a portion of the NISO region 382 and N-type buried layers 384, 385 have been formed. The NISO region 382 and/or N-type buried layers 384, 385 can be formed using various types of dopant drive-in processes, annealing (e.g., rapid thermal process (RTP) annealing), mask processing (e.g., resist deposition, resist development, resist stripping), etch processing, and/or so forth.

In some embodiment, the N-type buried layers 384, 385 can be formed so that the N-type buried layer 384 has a different volume (e.g., greater volume, smaller volume) than or a same volume as the N-type buried layer 385. The N-type buried layers 384, 385 can be separated by the NISO region 382, which as described above, can function as the channel 387 of the JFET portion 302 of the diode device 300. In other words, the channel 387 included in the NISO region 382 is disposed between the N-type buried layers 384, 385. Although not shown, the NISO region 382 and/or N-type buried layers 384, 385 may be formed entirely within a P-type semiconductor substrate 380 or entirely within a P-type epitaxial layer rather than being partially disposed within the P-type semiconductor substrate 380 and partially within the P-type epitaxial layer 370 as shown in FIG. 3A. In some embodiments, a thickness of the P-type epitaxial layer 370 can vary between a fraction of a micrometer and several micrometers (e.g., 2 µm, 5 µm, 20 µm), and at least some portions of the P-type epitaxial layer 370 can be grown and/or deposited. In some embodiments, the diode device 300 optionally may not include the N-type buried layer 385. In other words, the N-type buried layer 385 can be excluded from some embodiments of the diode device 300.

As shown in FIG. 3B, after the N-type buried layers 384, 385 and the NSIO region 382 have been formed within the P-type epitaxial layer 370 and the P-type semiconductor substrate 380, HVNWELL regions 390, 391 and a high-voltage P-type well (HVPWELL) region 360 are formed within the P-type epitaxial layer 370. As shown in FIG. 3B the high voltage N-type well regions 390, 391 and the high-voltage P-type well region 360 are formed above the NISO region 382. Also, the N+sink 369 are formed in the P-type epitaxial layer 370. As shown in FIG. 3B, N+sink 369 extends (e.g., extends continuously) between a surface of the P-type epitaxial layer 370 (e.g., a bottom surface of a PAD oxide layer 339) and the N-type buried layer 384.

The high voltage N-type well regions 390, 391, the high-voltage P-type well region 360, and the N+sink 369 can be formed using various types of dopant drive-in processes, annealing (e.g., rapid thermal process (RTP) annealing), mask processing (e.g., resist deposition, resist development, resist stripping), etch processing, and/or so forth. As shown in FIG. 3B, a nitride layer 338 and a mask layer 337 are formed above the PAD oxide layer 339 for subsequent oxide processing (e.g., field oxidation processing). In some embodiments, the PAD oxide layer 339 can be an oxide that is thermally grown and/or deposited.

As shown in FIG. 3C, an oxide 340 (also can be referred to as a field oxide) can be formed based on the nitride layer 338 and the mask layer 337 shown in FIG. 3B. In some embodiments, the oxide 340 can be an oxide that is thermally grown and/or deposited. In this figure, the nitride layer 338 and the mask layer 337 (shown in FIG. 3B) to facilitate formation of the oxide 340 have been stripped. As shown in FIG. 3C, the N+sink 369 extends between a bottom surface of the oxide 340 and the N-type buried layer 384. In other words, the N+sink 369 extends vertically (e.g., along a vertical axis) between a bottom surface of the oxide 340 and the N-type buried layer 384.

As shown in FIG. 3C, a polysilicon layer 398 is formed on top of the oxide 340. N-type well (NWELL) region 392 can be formed within the HVNWELL region 390, and P-type well (PWELL) regions 362, 363 can be formed, respectively, within the HVPWELL region 360 and the HVNWELL region 391 before the polysilicon layer 398 is formed on top of the oxide 340. In some embodiments, the polysilicon layer 398 can be deposited using deposition processing techniques (e.g., chemical vapor deposition (CVD) processing). In some embodiments, any type of conductive material can be used in conjunction with, or in place of, the polysilicon layer 398 such as a metallic material.

As shown in FIG. 3D, gate polysilicon portions 396, 397 are formed from the polysilicon layer 398 shown in FIG. 3C. The gate polysilicon portions 396, 397 can be formed using one or more etch processes. After the gate polysilicon portions 396 have been formed, a gate seal oxidation can be performed. In this embodiment, the PWELL region 363 is between the gate polysilicon portions 396, 397. Also, each of the gate polysilicon portions 396, 397 are in contact with spacers 395.

Heavily doped P-type (P+) regions 364, 365 are formed in the P-type well PWELL regions 362, 363, respectively. Also, a heavily doped N-type (N+) region 394 is formed in the NWELL region 392. One or more of the P+ regions 364, 365 can include one or more additional implants such as a P-type lateral double-diffused (PLDD) implants. Similarly, the N+ region 394 can include one or more additional implants such as an N-type lateral double-diffused (NLDD) implant. In a typical HVNMOS process, the P+ and N+ regions can be associated with source and/or drain regions of MOSFET devices. The N+ region 394 and/or the P+ regions 364, 365 can be formed using various types of dopant drive-in processes, annealing (e.g., rapid thermal process (RTP) annealing), mask processing (e.g., resist deposition, resist development, resist stripping), etch processing, and/or so forth.

In addition to the features described above in connection with FIG. 3E, FIG. 3E illustrates silicide layers 356, 357 disposed on polysilicon portions 396, 397, respectively. In some embodiments, silicide layers 326 can be formed when the silicide layers 356, 357 are formed. Polysilicon oxide layers 350 are also formed (e.g., disposed) on at least some portions of the oxide 340. The silicide layers 356, 357, 326 can be formed before or after the polysilicon oxide layers 350 are formed.

As shown in FIG. 3E, a dielectric layer 335 (e.g., a tetraethyl orthosilicate (TEOS) layer) is also included in the diode device 300. In some embodiments, the dielectric layer 335 can be deposited, polished, etched, and/or so forth. FIG. 3E also illustrates vias 324 coupled to conductive contacts 322. In some embodiments, the silicide layers 326, the vias 324, the conductive contacts 322, and/or so forth can be included in, or can be considered at least a portion of, one or more of the terminals 310, 320, 330. The silicide layers 236, the vias 324, and/or the conductive contacts 322 can be formed after the dielectric layer 335 has been formed.

In some embodiments, the N+sink 369 can have a dopant concentration (also can be referred to as a dopant level) that is the same as or greater than a dopant concentration included in the N-type buried layer 384. In some embodiments, the N+sink 369 can have a dopant concentration that is less than a dopant concentration included in the N-type buried layer 384. As shown in FIG. 3E, the N+sink 369 has at least a portion that is disposed (e.g., disposed laterally, disposed along a horizontal axis) between the PN junction 367 of the diode portion 301 and PWELL 363 of the JFET portion 302 of the diode device 300.

In some embodiments, one or more of the HVNWELL regions 390, 391 can have a dopant concentration less than a dopant concentration of the N+sink 369 and/or the N+BLs 384, 385. In some embodiments, N+BL 384 can have a dopant concentration different than a dopant concentration of the N+BL 385. In some embodiments, N+BL 384 can be formed using a process different than a process used to form N+BL 385. In some embodiments, one or more of the PWELLS 362, 363 can have a dopant concentration less than a dopant concentration of HVPWELL 360. In some embodiments, PWELL 362 can be formed using a process different than a process used to form PWELL 363.

In some embodiments, a Schottky diode can be fabricated within the diode device 300. The Schottky diode can be included in the diode device 300 instead of, or in addition to, the diode portion 310 shown in FIG. 3E. In such embodiments, the heavily doped P-type (P+) region 364 and the P-type well 362 may not be formed (as shown in FIGS. 3C and 3D) in the diode portion 310. In such embodiments, a rectifying contact for the Schottky diode can be also formed between the anode terminal 310 (e.g., a bottom portion of the anode terminal 310) and the HVNWELL region 391. The silicide layer 326 can be formed of a material (e.g., a platinum silicide, a palladium silicide, a nickel silicide, etc.) to facilitate formation of the rectifying contact for the Schottky diode. The dopant concentration (e.g., dopant level) within the HVNWELL region 391 can be defined to facilitate formation of the rectifying contact for the Schottky diode.

Figure 4:
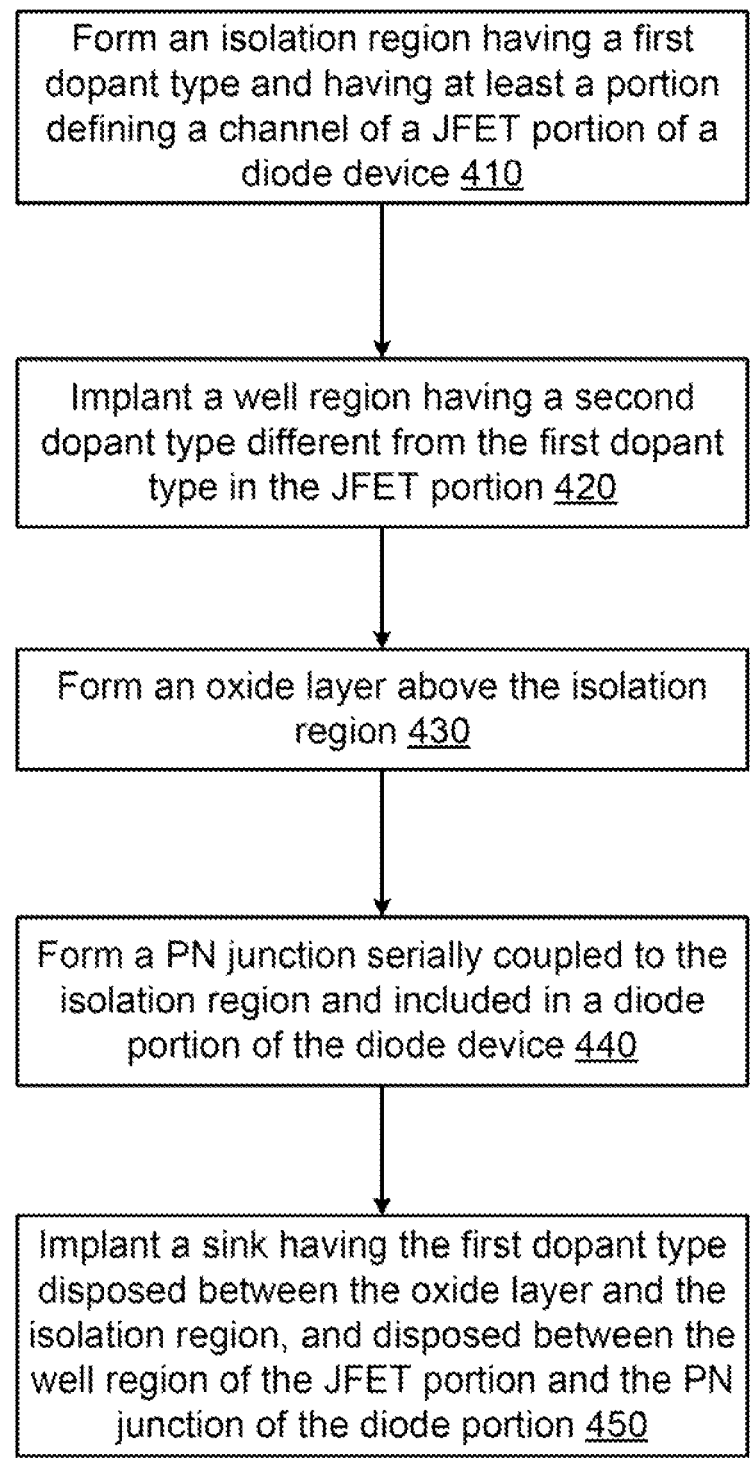
FIG. 4 is a diagram that illustrates a method for producing a diode device, according to an embodiment.

FIG. 4 is a diagram that illustrates a method for producing a diode device, according to an embodiment. In some embodiments, the diode device (e.g., diode device 100 shown in FIG. 1, diode device 300 shown in FIG. 3E) can be similar to one or more of the diode devices described above.

As shown in FIG. 4, an isolation region having a first dopant type and having at least a portion defining a channel of a JFET portion of a diode device is formed (block 410). In some embodiments, the first dopant type can be an N-type dopant. In some embodiments, the isolation region (e.g., NISO 382 shown in FIG. 3E) can be formed in at least a portion of an epitaxial layer (e.g., the epitaxial layer 370 shown in FIG. 3E) and/or in at least a portion of a semiconductor substrate (e.g., the semiconductor substrate 380 shown in FIG. 3).

A well region having a second dopant type different from the first dopant type is implanted in the JFET portion (block 420). In some embodiments, the second dopant type can be a P-type dopant. The well region can be the PWELL region 363 shown in FIG. 3E. In some embodiments, implanting can include one or more of dopant drive-in, annealing, mask processing, and/or so forth associated with forming a well region.

An oxide layer is formed above the isolation region (block 430). In some embodiments, the oxide layer can be the oxide 340 shown in FIG. 3. In some embodiments, the oxide layer can be a field oxidation layer.

A PN junction serially coupled to the isolation region and included in a diode portion of the diode device is formed above the isolation region (block 440). In some embodiments, the PN junction can be the PN junction 367 shown in FIG. 3E.

A sink having the first dopant type is implanted between the oxide layer and the isolation region, and implanted between the well region of the JFET portion and the PN junction of the diode portion (block 450). In some embodiments, the sink can be the N+sink 369 shown in FIG. 3E. In some embodiments, the sink can be disposed vertically between the oxide layer and the isolation region, and can be disposed laterally between the well region of the JFET portion and the PN junction of the diode portion.

In some embodiments, a buried layer having the first dopant type is formed in the diode portion of the isolation region of the diode device. In some embodiments, the buried layer has a concentration of the first dopant type that is greater than a concentration of the first dopant type of the isolation region.

Figure 5:
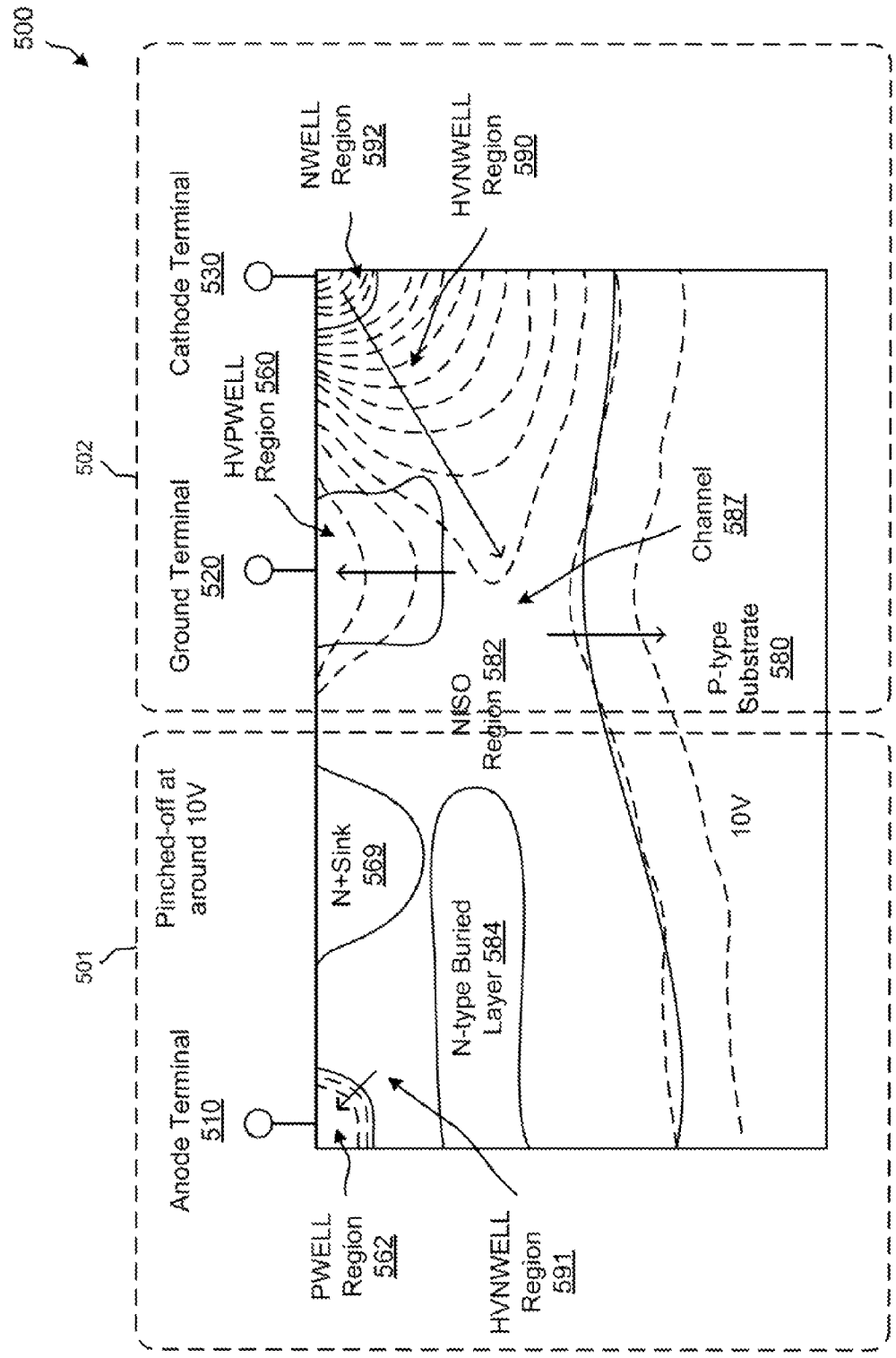
FIG. 5 is a diagram that illustrates potentials within a diode device when the diode device is reverse biased.

FIG. 5 is a diagram that illustrates potentials (e.g., equipotential lines or constant potential lines, voltage lines) within a diode device 500 when the diode device 500 is reverse biased. As shown in FIG. 5, the diode device 500 includes an anode terminal 510, a ground terminal 520, and a cathode terminal 530. The features included in the diode device 500 correspond approximately with the features included in the diode device 300 shown in FIG. 3E.

As shown in FIG. 5, the diode device 500 includes a P-well region 562, a HVNWELL region 591, an N-type buried layer 584, and an N+sink 569 associated with a diode portion 501. The diode device 500 also includes an N-well region 592, a HVNWELL region 590, and a HVPWELL region 560 associated with a JFET portion 502. The NISO region extends between the diode portion 501 and the JFET portion 502. The diode device 500 is formed within a P-type substrate 580.

In this embodiment, decreasing potential (e.g., voltage) is illustrated with straight arrows. In some embodiments, the voltage at the cathode terminal 530 can be greater than, for example, 20 V (e.g., 50V, 100 V, 150 V), and the voltages at the anode terminal 510 and the ground terminal 520 can be approximately 0 V. In some embodiments, the channel 587 can be pinched off at approximately 10 V. In some embodiments, the diode device 500 can be configured so that the channel 587 is pinched off at a voltage less than 10 V (e.g., 2 V, 5 V) or at a voltage greater than 10 V (e.g., 15 V, 20 V).

Figure 6:
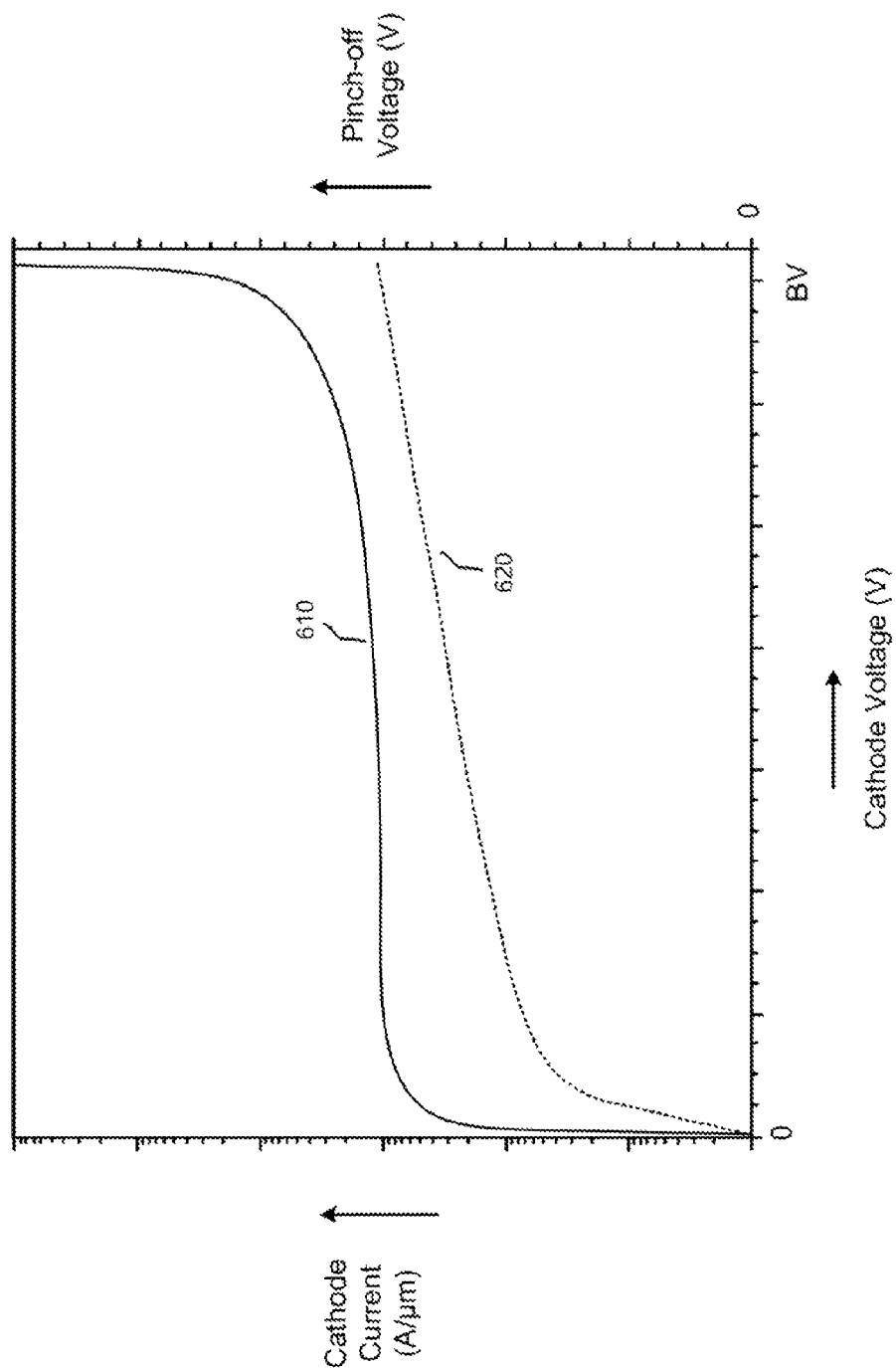
FIG. 6 is a graph that illustrates a breakdown voltage and a pinch-off voltage of a diode device, according to an embodiment.

FIG. 6 is a graph that illustrates a cathode current 610 and a pinch-off voltage 620 of a diode device, according to an embodiment. As shown in FIG. 6, a cathode current 610 (from the cathode) in A/μm (shown along a first y-axis) increases as the cathode voltage (shown in volts V) increases from 0 V. In this embodiment, the cathode current 610 is shown on a logarithmic scale, and the cathode voltage is shown along the x-axis. The cathode current 610 remains approximately constant until at approximately a breakdown voltage BV, the cathode current increases dramatically with, for example, avalanche breakdown. In some embodiments, the breakdown voltage can be greater than 100 volts (e.g., 140 V, 150 V).

Also as shown in FIG. 6, a pinch-off voltage 620 (shown along a second y-axis) of the diode device increases with increasing cathode voltage. Specifically, the pinch off voltage increases approximately linearly while the cathode current is approximately a constant value. In some embodiments, the pinch-off voltage 620 can be less than approximately 15 V (e.g., 10 V, 5 V). In some embodiments, the pinch-off voltage 620 can be approximated by measuring a voltage at a sink region of the diode device (e.g., N+sink 369 shown in FIG. 3E).

Figure 7:
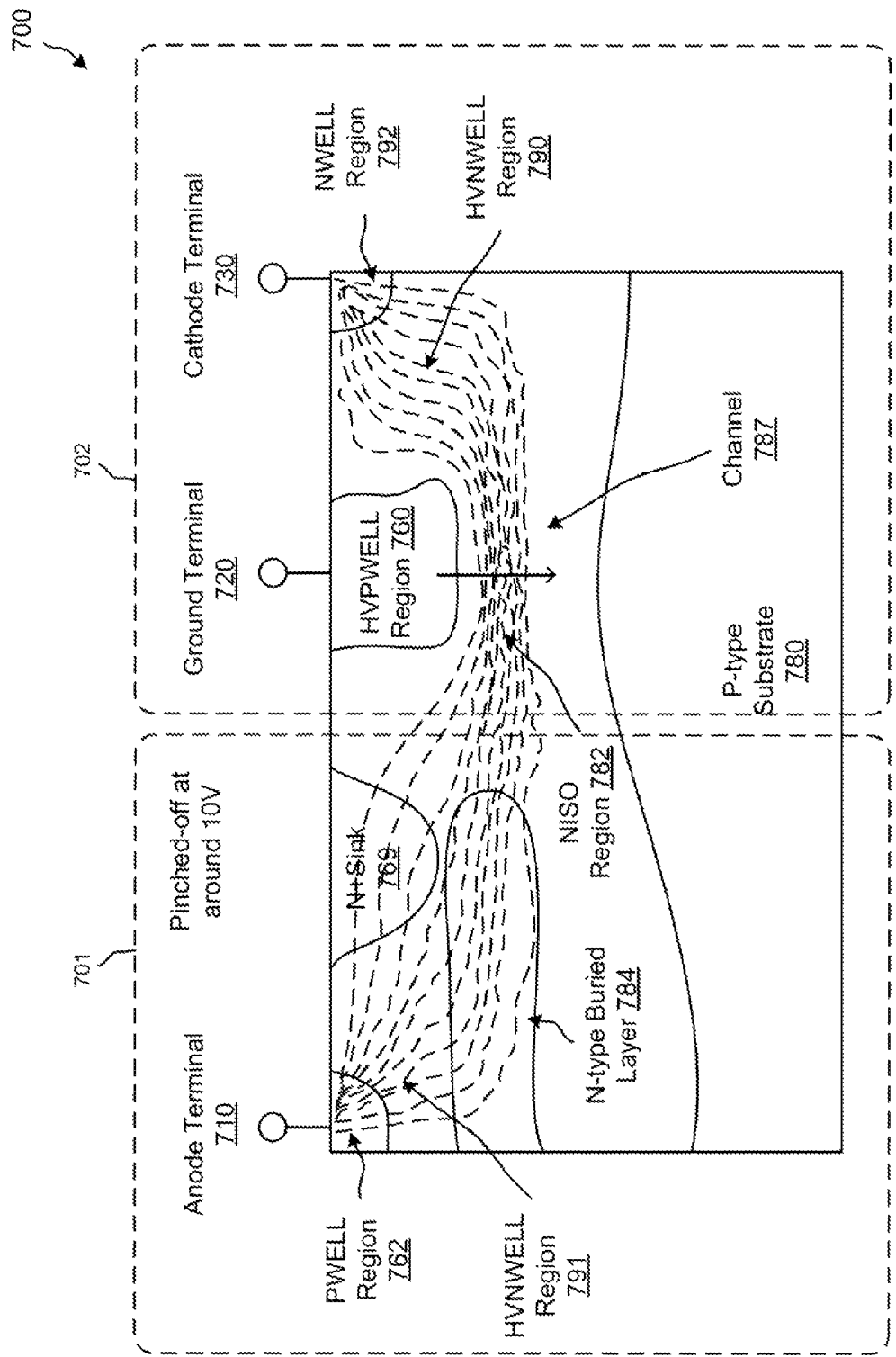
FIG. 7 is a diagram that illustrates current within a diode device when the diode device is forward biased.

FIG. 7 is a diagram that illustrates current (e.g., iso-current lines or constant current lines) within a diode device 700 when the diode device 700 is forward biased. As shown in FIG. 7, the diode device 700 includes an anode terminal 710, a ground terminal 720, and a cathode terminal 730. The features included in the diode device 700 correspond approximately with the features included in the diode device 300 shown in FIG. 3E.

As shown in FIG. 7, the diode device 700 includes a P-well region 762, a HVNWELL region 791, an N-type buried layer 784, and an N+sink 769 associated with a diode portion 701. The diode device 700 also includes an N-well region 792, a HVNWELL region 790, and a HVPWELL region 760 associated with a JFET portion 702. The NISO region extends between the diode portion 701 and the JFET portion 702. The diode device 700 is formed within a P-type substrate 780.

In this embodiment, decreasing current is illustrated with a straight arrow. In some embodiments, the voltage at the ground terminal 720 and at the cathode terminal 730 can be approximately 0 V, and the voltage at the anode terminal 710 can be approximately 2 V when the diode device is forward biased. In other words, the voltage of the cathode terminal 730 can be approximately equal to, or equal to, the voltage of the anode terminal 710. As shown in FIG. 7, the current flows through the channel 787 included in NISO region 782. Also, as shown in FIG. 7, current does not flow into the P-type substrate 780 from the anode terminal 710 when the diode device 700 is forward biased.

Figure 8:
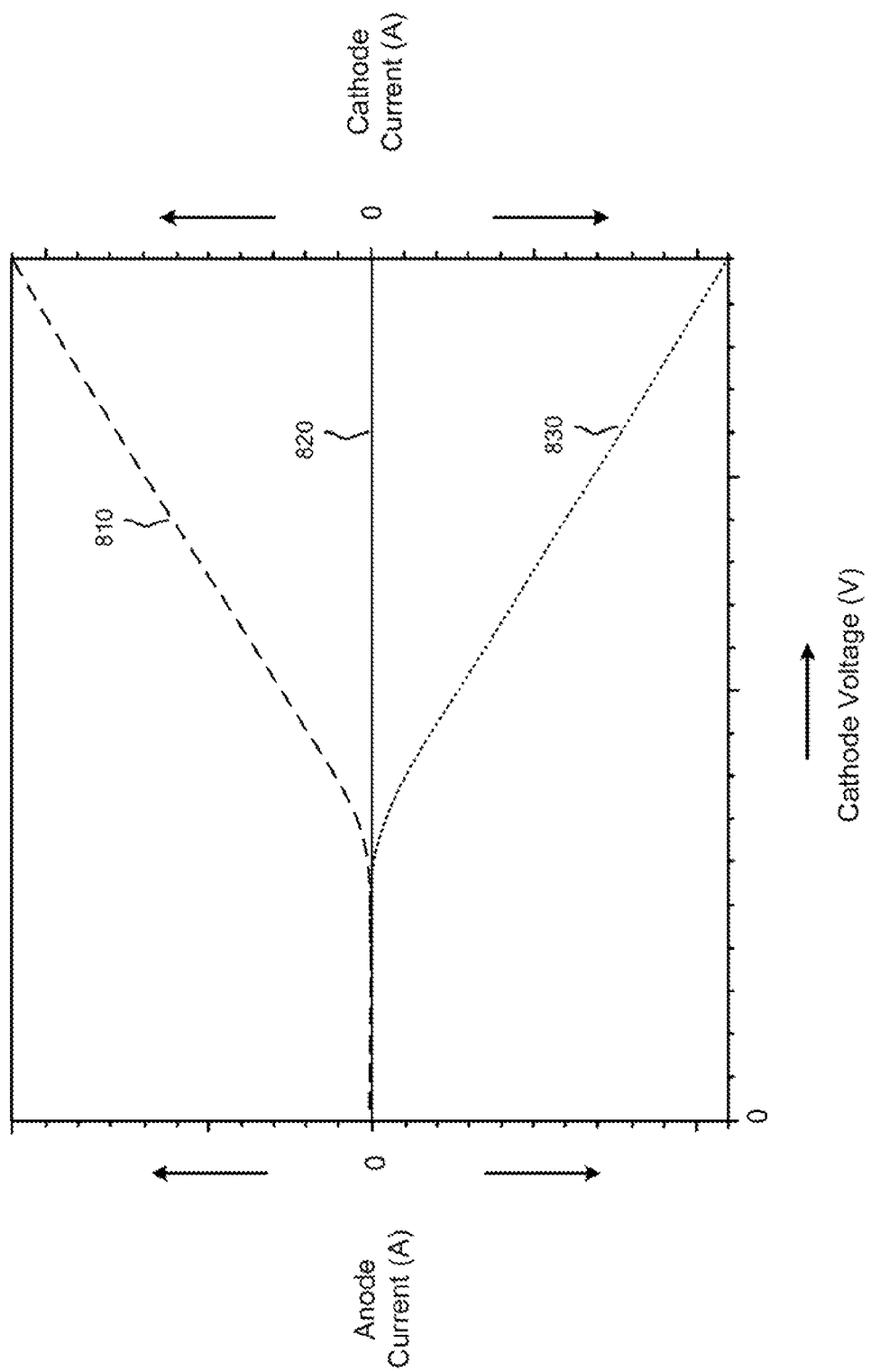
FIG. 8 is a graph that illustrates currents within a diode device when the diode device is forward biased, according to an embodiment.

FIG. 8 is a graph that illustrates currents within a diode device when the diode device is forward biased, according to an embodiment. As shown in FIG. 8, an anode current 810 (from an anode to a cathode of the diode device) increases with increasing cathode voltage, and a cathode current 830 (a negative current into the cathode) decreases with increasing cathode voltage. As shown in FIG. 8, a substrate current 820 remains at 0 A despite changes in the cathode voltage. In some embodiments, the substrate current 820 can remain at zero (or approximately 0) even with increases in cathode voltage beyond 100 V.

In one general aspect, an apparatus can include an anode terminal, and a cathode terminal. The apparatus can include a junction field-effect transistor (JFET) portion having a channel disposed within a semiconductor substrate and defining a first portion of an electrical path between the anode terminal and the cathode terminal. The apparatus can also include a diode portion formed within the semiconductor substrate and defining a second portion of the electrical path between the anode terminal and the cathode terminal. The diode portion can be serially coupled to the channel of the JFET device.

In some embodiments, current flows from the anode terminal to the cathode terminal through the channel of the JFET portion when the diode portion is forward biased, and current is substantially prevented from flowing from the cathode terminal to the anode terminal through the channel of the JFET portion when the channel of the JFET portion is depleted and the diode portion is reverse biased. In some embodiments, the apparatus can include an isolation region disposed below the anode terminal and the cathode terminal where the channel is disposed within the isolation region and has a first dopant type different from a second dopant type of the semiconductor substrate.

In some embodiments, the apparatus can include an isolation region having a heavily doped portion disposed below the anode terminal. In some embodiments, the apparatus can include an isolation region having a first heavily doped portion disposed below the anode terminal and a second heavily doped portion disposed below the cathode terminal. The first heavily doped portion can be isolated from the second heavily doped portion by a lightly doped portion of the isolation region.

In some embodiments, an isolation region, the channel being disposed within a portion of the isolation region having a dopant concentration lower than a dopant concentration of a portion of the isolation region disposed below at least one of the anode terminal or the cathode terminal. In some embodiments, a ground terminal of the JFET portion disposed between the anode terminal and the cathode terminal.

In some embodiments, at least a portion of the diode portion and at least a portion of the channel are formed within a common epitaxial layer. In some embodiments, a voltage drop between the anode terminal and the cathode terminal when the diode portion is forward biased is approximately two times a forward bias voltage of the diode portion. In some embodiments, the diode portion includes a Schottky diode.

In another general aspect, an apparatus can include an anode terminal and a cathode terminal. The apparatus can include an isolation region having a heavily doped portion disposed below the anode terminal, and a lightly doped portion disposed between the heavily doped portion and the cathode terminal. The apparatus can include a junction field-effect transistor (JFET) portion having a channel disposed within the isolation region, and a diode portion including a PN junction having at least a portion disposed between the anode terminal and the heavily doped portion of the isolation region.

In some embodiments, the isolation region is disposed within a semiconductor substrate and is doped with a first dopant type. The apparatus can include a ground terminal of the JFET portion disposed between the anode terminal and the cathode terminal. The anode terminal can be in contact with a first portion of the semiconductor substrate doped with a second dopant type, and the cathode can be in contact with a second portion of the semiconductor substrate doped with the first dopant type. A third portion of the semiconductor substrate can be disposed between the ground terminal and the isolation region doped with the second dopant type.

In some embodiments, the heavily doped portion is a first heavily doped portion, and the apparatus can include a second heavily doped portion disposed below the cathode terminal where the channel of the isolation region is disposed between the first heavily doped portion and the second heavily doped portion. In some embodiments, the channel defines a first portion of an electrical path between the anode terminal and the cathode terminal where the diode portion defines a second portion of the electrical path between the anode terminal and the cathode terminal, and the diode portion is serially coupled to the channel of the JFET device.

In some embodiments, current flows from the anode terminal to the cathode terminal through the channel of the JFET portion when the diode portion is forward biased. In some embodiments, the JFET portion is configured to function as a blocking component when the channel of the JFET portion is depleted and the diode portion is reverse biased.

In some embodiments, the isolation region has a first dopant type different from a second dopant type of a semiconductor substrate including the JFET portion and the diode portion. In some embodiments, the heavily doped portion is a first heavily doped portion isolated from a second heavily doped portion by the lightly doped portion of the isolation region. The first heavily doped portion, the second heavily, and the isolation region can be doped with the same type of dopant.

In yet another general aspect, a method can include forming an isolation region having a first dopant type and having at least a portion defining a channel of a junction field-effect transistor (JFET) portion of a diode device, and implanting a well region having a second dopant type different from the first dopant type in the JFET portion. The method can include forming an oxide layer above the isolation region, and forming a PN junction serially coupled to the isolation region and included in a diode portion of the diode device above the isolation region. The method can also include implanting a sink, having the first dopant type, between the oxide layer and the isolation region, and between the well region of the JFET portion and the PN junction of the diode portion.

In some embodiments, the isolation region is formed in a portion of an epitaxial layer and in at least a portion of a semiconductor substrate, and the semiconductor substrate is common to the JFET portion and the diode portion of the diode device. In some embodiments, the sink is disposed vertically between the oxide layer and the isolation region, and is disposed laterally between the well region of the JFET portion and the PN junction of the diode portion.

In some embodiments, the method can include forming a buried layer having the first dopant type in the diode portion of the isolation region of the diode device where the sink is in contact with the buried layer. In some embodiments, the method can include forming a buried layer below the anode terminal and below the sink, the buried layer having a concentration of the first dopant type greater than a concentration of the first dopant type of the isolation region.

In some embodiments, the method can include forming a first buried layer on a first side of the channel, the first buried layer having a concentration of the first dopant type greater than a concentration of the first dopant type of the isolation region. The method can also include forming a second buried layer on a second side of the channel.

Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Germanium (Ge), Silicon Carbide (SiC), type III-V semiconductor substrates, type II-VI semiconductor substrates, and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   an anode terminal;
   a cathode terminal;
   a semiconductor substrate;
   an epitaxial layer disposed on the semiconductor substrate;
   an isolation region including a first heavily doped portion and a second heavily doped portion;
   a well region disposed between the isolation region and the cathode;
   a junction field-effect transistor (JFET) portion having a channel disposed within the semiconductor substrate and defining a first portion of an electrical path between the anode terminal and the cathode terminal, the first portion of the electrical path including the first heavily doped portion; and
   a diode portion formed within the semiconductor substrate and defining a second portion of the electrical path between the anode terminal and the cathode terminal, the diode portion being serially coupled to the channel of the JFET portion, the second portion of the electrical path including the second heavily doped portion.

2. The apparatus of claim 1, wherein current flows from the anode terminal to the cathode terminal through the channel of the JFET portion when the diode portion is forward biased, and current is substantially prevented from flowing from the cathode terminal to the anode terminal through the channel of the JFET portion when the channel of the JFET portion is depleted and the diode portion is reverse biased.

3. The apparatus of claim 1, further comprising:
   an isolation region disposed below the anode terminal and the cathode terminal, the channel being disposed within the isolation region and having a first dopant type different from a second dopant type of the semiconductor substrate.

4. The apparatus of claim 1, further comprising:
   an isolation region having a heavily doped portion disposed below the anode terminal.

5. The apparatus of claim 1, further comprising:
   an isolation region having a first heavily doped portion disposed below the anode terminal and a second heavily doped portion disposed below the cathode terminal, the first heavily doped portion being isolated from the second heavily doped portion by a lightly doped portion of the isolation region.

6. The apparatus of claim 1, further comprising:
an isolation region, the channel being disposed within a portion of the isolation region having a dopant concentration lower than a dopant concentration of a portion of the isolation region disposed below at least one of the anode terminal or the cathode terminal.

7. The apparatus of claim 1, further comprising:
a ground terminal of the JFET portion disposed between the anode terminal and the cathode terminal.

8. The apparatus of claim 1, wherein at least a portion of the diode portion and at least a portion of the channel are formed within a common epitaxial layer.

9. The apparatus of claim 1, wherein a voltage drop between the anode terminal and the cathode terminal when the diode portion is forward biased is approximately two times a forward bias voltage of the diode portion.

10. The apparatus of claim 1, wherein the diode portion includes a Schottky diode.

11. An apparatus, comprising:
an anode terminal;
a cathode terminal;
a semiconductor substrate;
an epitaxial layer disposed on the semiconductor substrate;
an isolation region overlapping the epitaxial layer and the semiconductor substrate, the isolation region having a first heavily doped portion disposed below the anode terminal, having a second heavily doped portion disposed below the cathode terminal, and having a lightly doped portion disposed between the first heavily doped portion and the second heavily doped portion;
a junction field-effect transistor (JFET) portion having a channel disposed within the isolation region; and
a diode portion including a PN junction having at least a portion disposed between the anode terminal and the heavily doped portion of the isolation region.

12. The apparatus of claim 11, wherein the isolation region is disposed within the semiconductor substrate and is doped with a first dopant type,
the apparatus further comprising:
a ground terminal of the JFET portion disposed between the anode terminal and the cathode terminal, the anode terminal being in contact with a first portion of the semiconductor substrate doped with a second dopant type, the cathode being in contact with a second portion of the semiconductor substrate doped with the first dopant type, a third portion of the semiconductor substrate disposed between the ground terminal and the isolation region being doped with the second dopant type.

13. The apparatus of claim 11, wherein
the channel of the isolation region is disposed between the first heavily doped portion and the second heavily doped portion.

14. The apparatus of claim 11, wherein the channel defines a first portion of an electrical path between the anode terminal and the cathode terminal, the diode portion defines a second portion of the electrical path between the anode terminal and the cathode terminal, and the diode portion is serially coupled to the channel of the JFET portion.

15. The apparatus of claim 11, wherein current flows from the anode terminal to the cathode terminal through the channel of the JFET portion when the diode portion is forward biased.

16. The apparatus of claim 11, wherein the JFET portion is configured to function as a blocking component when the channel of the JFET portion is depleted and the diode portion is reverse biased.

17. The apparatus of claim 11, wherein the isolation region has a first dopant type different from a second dopant type of a semiconductor substrate including the JFET portion and the diode portion.

18. The apparatus of claim 11, wherein the heavily doped portion is a first heavily doped portion isolated from a second heavily doped portion by the lightly doped portion of the isolation region,
the first heavily doped portion, the second heavily, and the isolation region are doped with the same type of dopant.

19. An apparatus, comprising:
an isolation region having a first dopant type and having at least a portion defining a channel of a junction field-effect transistor (JFET) portion, the isolation region is disposed in a portion of an epitaxial layer and in at least a portion of a semiconductor substrate;
a PN junction serially coupled to the isolation region and included in a diode portion;
a first buried layer disposed in the isolation region and having the first dopant type, the first buried layer being included in the diode portion;
a second buried layer disposed in the isolation region and having the first dopant type, the second buried layer being included in the JFET portion;
a first well region in the JFET portion having a second dopant type different from the first dopant type;
a second well region in the JFET portion having the first dopant type, and being disposed between the second buried layer and a conductive contact; and
a sink having the first dopant type and being included in the diode portion.

20. The apparatus of claim 19, wherein the semiconductor substrate is common to the JFET portion and the diode portion.

21. The apparatus of claim 19, wherein the sink is in contact with the first buried layer.

22. The apparatus of claim 19, wherein the first buried layer is disposed below an anode terminal and below the sink, the first buried layer has a concentration of the first dopant type greater than a concentration of the first dopant type of the isolation region.

23. The apparatus of claim 19, wherein the first buried layer is disposed on a first side of the channel, the first buried layer has a concentration of the first dopant type greater than a concentration of the first dopant type of the isolation region, the second buried layer is on a second side of the channel.

* * * * *